United States Patent [19]
Fumey

[11] Patent Number: 4,565,931
[45] Date of Patent: Jan. 21, 1986

[54] ISOLATED AMPLIFIER CIRCUIT FOR AMPLIFYING PULSES, IN PARTICULAR FOR A HIGH VOLTAGE OUTPUT

[75] Inventor: Michel J. R. Fumey, Saint-Cloud, France

[73] Assignee: Electronizue Serge Dassault S.A., Paris, France

[21] Appl. No.: 691,776

[22] Filed: Jan. 16, 1985

[30] Foreign Application Priority Data

Jan. 16, 1984 [FR] France ................................ 84 00629

[51] Int. Cl.⁴ ........................ H03K 5/00; H01F 27/00; H03F 3/217
[52] U.S. Cl. .................................. 307/262; 307/268; 307/270; 307/571; 332/251; 332/171; 332/65; 336/200
[58] Field of Search .................... 330/10, 65, 165, 171, 330/207 A, 251, 276; 307/270, 262, 243, 268, 571; 336/90, 92, 200

[56] References Cited

U.S. PATENT DOCUMENTS

3,833,872  9/1974  Marcus et al. .................. 336/200 X
4,359,650  11/1982  Newcomb .......................... 307/200

FOREIGN PATENT DOCUMENTS

1591820  8/1972  Fed. Rep. of Germany .
1082483  9/1967  United Kingdom .

OTHER PUBLICATIONS

Harman, "Coupling P.W.M. Drive Waveforms", New Electronics, vol. 16, No. 6, Mar. 1983, p. 28.

Primary Examiner—James B. Mullins
Attorney, Agent, or Firm—Pollock, Vande Sande & Priddy

[57] ABSTRACT

The amplifier circuit comprises a low voltage input stage (1) connected via transformers (3) to a high voltage output stage (5). The transformers comprise a central transformer having one primary winding (30) and two oppositely-wound secondary windings (31, 32), and two end transformers each having a primary winding (33, 35) and a secondary winding (34, 36). The low voltage input stage comprises an input amplifier (10), a differentiator (12, 13) and two oscillators (23, 25). The amplifier output is fed via the differentiator to the primary winding of the central transformer and is connected to both oscillators in such a manner as to actuate one or other of them depending on its polarity. Each of the oscilators is connected to the primary winding of a respective one of the two end transformers. The output stage comprises two controllable switches (61, 62) connected symmetrically in series about a mid point (R), each of the switches being controlled, via a respective shaping circuit (53, 54), by a respective one of the secondary windings of the central transformer and also by the secondary winding of a respective one of the end transformers. When made using hybrid circuit technology the resulting amplifier circuit is compact and capable of high performance.

6 Claims, 11 Drawing Figures

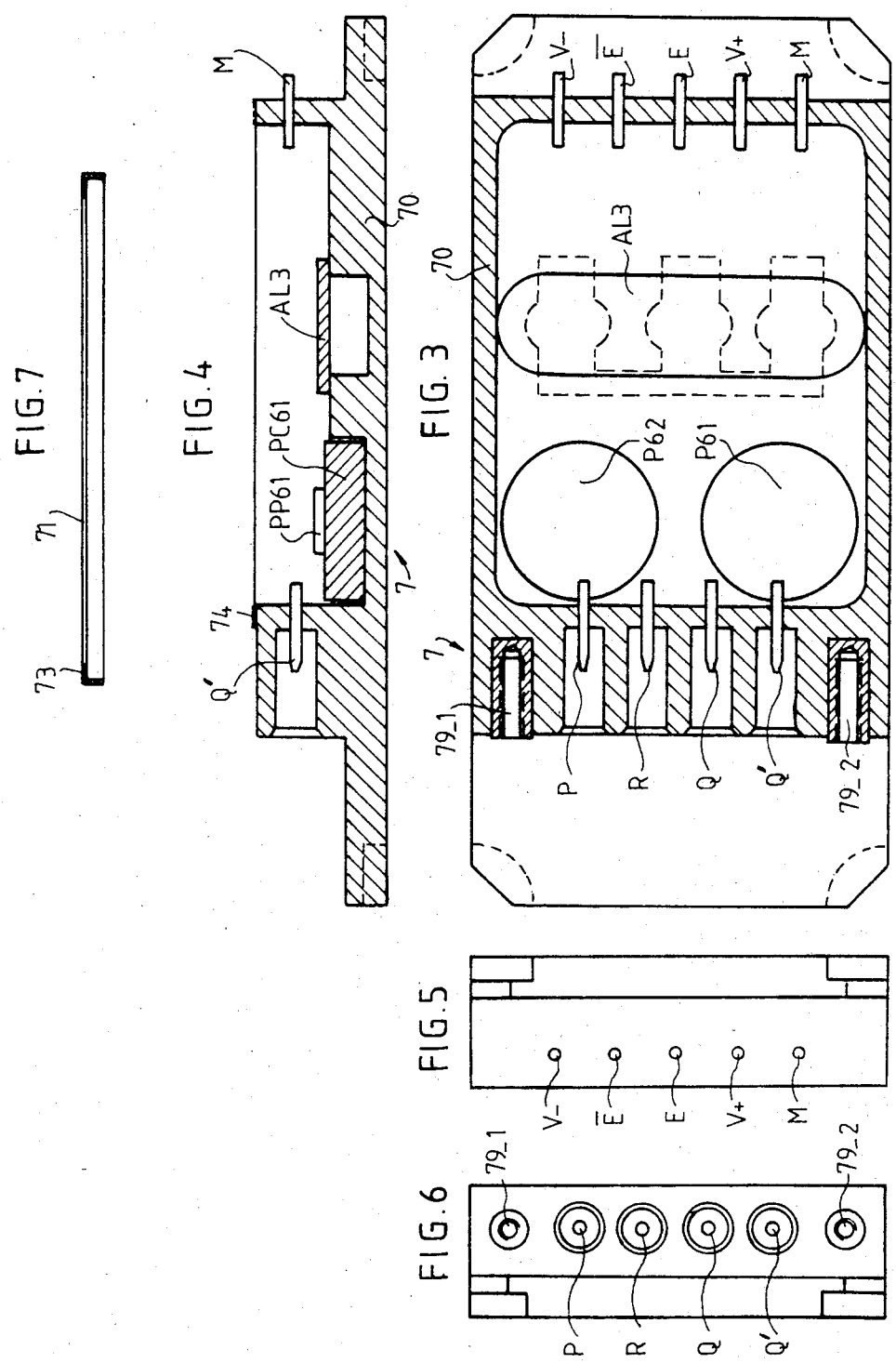

ISOLATED AMPLIFIER CIRCUIT FOR AMPLIFYING PULSES, IN PARTICULAR FOR A HIGH VOLTAGE OUTPUT

This invention relates to an electronic amplifier circuit for amplifying isolated pulses, in particular for a high voltage output.

BACKGROUND OF THE INVENTION

The problem faced by the Applicant was to design such an amplifier that was both compact and of high performance. The amplifier was to be compact in spite of having sufficiently high insulation to withstand a potential difference of several thousand volts between its input and output, and its performance was to include high gain, short response time, and high bandwidth of admissible rectangular input pulses. These requirements are technically contradictory.

Nonetheless, the present invention provides means capable of meeting these requirements and of providing an amplifier circuit which is both compact and of high performance.

The amplifier circuit is of the type comprising a low voltage input stage coupled via transformers to a high voltage output stage.

SUMMARY OF THE INVENTION

According to a first aspect of the invention:

the transformers comprise a central transformer having one primary winding and two oppositely-wound secondary windings, and two end transformers each having a primary winding and a secondary winding;

the low voltage input stage comprises an input amplifier, a differentiator and two oscillators, the amplifier output being fed via the differentiator to the primary winding of the central transformer and being connected to both oscillators in such a manner as to actuate one or other of the two oscillators depending on its polarity, each of the oscillators being connected to the primary winding of a respective one of the two end transformers; and the output stage comprises two controllable switches connected symmetrically in series about a mid point, each of the switches being controlled, via a respective shaping circuit, by a respective one of the secondary windings of the central transformer and also by the secondary winding of a respective one of the end transformers.

According to a second aspect of the invention, the amplifier circuit is made in the form of a hybrid circuit on a ceramic substrate in a housing which is likewise made of ceramic, which housing is sealed, and is filled with an inert atmosphere, preferably dry nitrogen.

According to a third aspect of the inventiion, the said transformers are made by silk-screening the windings on a ceramic support, with insulating layers being interposed between the primary windings and the secondary windings.

According to a fourth aspect of the invention, the switches are constituted by power transistors, preferably MOSFETs, on individual chips, which chips are mounted on copper disks that are in turn brazed to the ceramic housing.

It is thus possible to obtain a compact structure, having good heat dissipation, excellent electrical insulation, and high performance. The housing is made completely of ceramic, and is sealed around its cover and around its input and output connection pins.

BRIEF DESCRIPTION OF THE DRAWINGS

An embodiment of the invention is described by way of example with reference to the accompanying drawings, in which:

FIG. 3 is a similar view to FIG. 2, but facing the other way;

FIGS. 4 to 8 are various views of the FIG. 3 housing, FIG. 4 is a longitudinal section, FIG. 5 is an elevation of the right hand end, FIG. 6 is an elevation of the left hand end, and FIGS. 7 and 8 are respectively views of a long edge and of the underside of a cover for the housing;

MORE DETAILED DESCRIPTION

Figure 1:
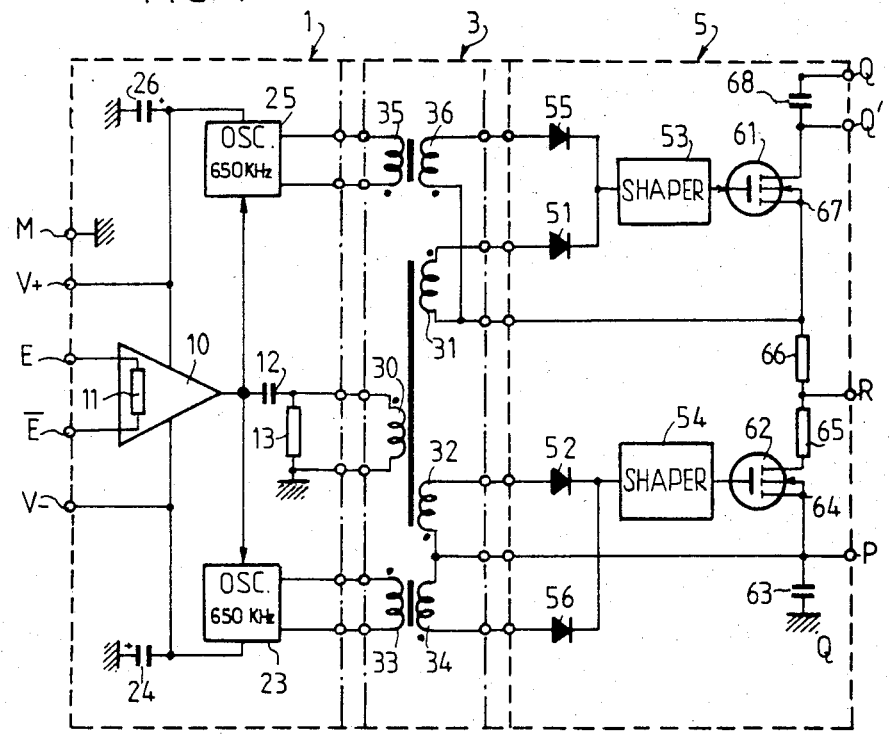
FIG. 1 is the electrical circuit diagram of an amplifier in accordance with the invention.

In FIG. 1, the electrical circuit is shown connected to two power supply terminals V+ and V− supplying voltages which may have a magnitude of about 10 volts for example. There is a ground terminal M defining a potential about which the power supply is symmetrical, and there are two signal input terminals E and E̅ for receiving logically complementary input signals.

This power supply is fed to an input circuit 1, which input circuit is connected via a set of transformers 3 to an output circuit 5.

The output circuit 5 is intended to operate from an external high voltage power supply. It includes three connection terminals P, R, and Q, and the terminal Q may be connected in parallel with a fourth terminal Q'. Power is supplied between P and Q'. The point R is switched between P and Q', as explained below.

The input circuit 1 includes an operational amplifier 10 having an input resistance 11 connected between its differential input terminals E and E̅ to receive input signals. The terminals V+ and V− power the amplifier 10, and they also power two oscillator circuits 25 and 23 which operate, for example, at 650 kHz under the control of respective control inputs connected to the output of the amplifier 10.

Thus, the terminal V+ is connected to the positive plate of a capacitor 26 and also to one terminal of the oscillator 25. Similarly, the terminal V− is connected to the negative plate of a capacitor 24 and to one terminal of the oscillator 23. The other plates of the capacitors 24 and 26 are connected to ground.

The output of the amplifier 10 is also connected to a differentiator circuit comprising a series capacitor 12 followed by a parallel resistor 13 connected to ground; the common point between the capacitor 12 and the resistor 13 is connected to one end of a primary winding 30 whose other end is connected to ground and whose inductance contributes to differentiating.

The primary winding 30 is the primary winding of a central transformer having two secondary windings 31 and 32.

Each of the oscillators 23 and 25 excites a respective primary winding 33 or 35 of a corresponding end transformer having secondary windings marked 34 and 36 respectively. The oscillators 23 and 25 operate alternately, ie. at any one time only one or other of them is in operation.

When the voltage difference between the rectangular input signals at terminals E and $\overline{E}$ changes sign, the amplifier 10 amplifies the transition and applies a pulse to the differentiator, which pulse is transmitted with sign unchanged to the terminals of the primary winding 30. If the pulse is positive, ie. the voltage on E is greater than the voltage on $\overline{E}$, a positive pulse appears at the terminals of the secondary winding 31 and a negative pulse appears at the terminals of the winding 32. This is shown in the circuit diagram in conventional manner by means of dots next to each winding to show the winding direction thereof. If the input pulse is negative, the roles of the secondary windings 31 and 32 are interchanged.

Further, if the voltage on E is greater than the voltage on $\overline{E}$, the oscillator 25 is put into operation, while if the voltage on $\overline{E}$ is greater than the voltage on E, it is the other oscillator 23 which is put into operation. The oscillator 25 generates a signal at 650 kHz which is transferred without inversion to the secondary winding 36, and the resulting voltage is developed between the anode of a diode 55 and a point in common between the secondary winding 36 and the secondary winding 31. The cathode of the diode 55 is applied to a shaping circuit 53.

At the same time, the voltage appearing across the secondary 31 is likewise applied via the anode of a diode 51 to the shaping circuit 53 which is also connected to the cathode of the diode 51. The shaping circuit 53 controls a switch 61. The circuit controlled by the switch 61 is connected between the terminal Q' and a point 67. It may be observed at this point that the terminal Q' may be connected to the terminal Q either directly or via a capacitor 68.

The common reference point of the windings 31 and 36 is connected to the point 67. The point 67 is further connected via a resistor 66 to the mid point terminal R. The mid point R is also connected via a resistor 65 to one terminal of a circuit controlled by a second switch 62. The other terminal 64 of the circuit controlled by the switch 62 is connected to the terminal P. This circuit is known in the art as a "totem pole" circuit, and its output is at terminal R. Finally, the terminal P is connected via a decoupling capacitor 63 to the terminal Q. The voltage difference between the terminal Q and the ground of the input circuit may be several thousand volts. The amplitude of the output modulation applied between the terminals P and Q' may be several hundred volts.

As before, the secondary winding 32 has a "hot" point connected to the anode of a diode 52 whose cathode is connected to a shaping circuit 54 for actuating the second switch 62. The other end of the secondary winding 32 constitutes a reference point connected to the terminal P and to one terminal of the secondary winding 34. The other terminal of the secondary winding 34 is connected to the anode of a diode 56 whose cathode is also connected to the shaping circuit 54.

The windings 33 and 34 are wound in opposite directions, while the windings 35 and 36 are wound in the same direction. This is to take account of the particular way in which the oscillators 23 and 25 operate.

The circuit operates as follows:

When the transition changes the potential difference between the terminals E and $\overline{E}$ from negative to positive, a pulse appears in the primary winding 30. The two secondary windings 31 and 32 are thus subjected to pulses of opposing signs. The pulse in the secondary 31 excites the shaping circuit 53 and causes the switch 61 to conduct. Conversely, the pulse in the secondary 32 acts to prevent the switch 62 from conducting. This ensures very fast change over from the preceding state in which the switch 62 was conducting to the succeeding state in which the switch 61 becomes conductive and the switch 62 is turned off.

At the same time as the above-described pulse is produced, the oscillator 25 is turned on. Its output signal passes through the transformer having the primary winding 35 and the secondary winding 36. The output signal is rectified by the diode 55 and is applied to the shaping circuit 53. This additional signal ensures that the switch 61 continues to conduct. As is explained below, the switch 61 is advantageously a MOSFET (Metal Oxide Silicon Field Effect Transistor) and thus very fast. Its input capacitance tends to discharge after a certain length of time. The signal derived from the oscillator 25 thus contributes to keeping the first switch 61 in the conductive state.

Suppose that a negative pulse then occurs, i.e. the potential difference between E and $\overline{E}$ rapidly becomes strongly negative. As before, the central transformer operates by means of its secondary winding 32 to switch on the switch 62 and by means of its secondary winding 31 to switch off the switch 61. After being initially turned on by the central transformer, the switch 62 is maintained in the conductive state by the oscillator 23 which has itself come into operation following the negative pulse.

The critical points in the above-described circuit are isolation by means of the transformers and dumping the energy dissipated by the switches 61 and 62. The Applicant has observed that using hybrid circuit technology to make the circuit, ensures a compact implementation capable of high performance.

Figure 2:
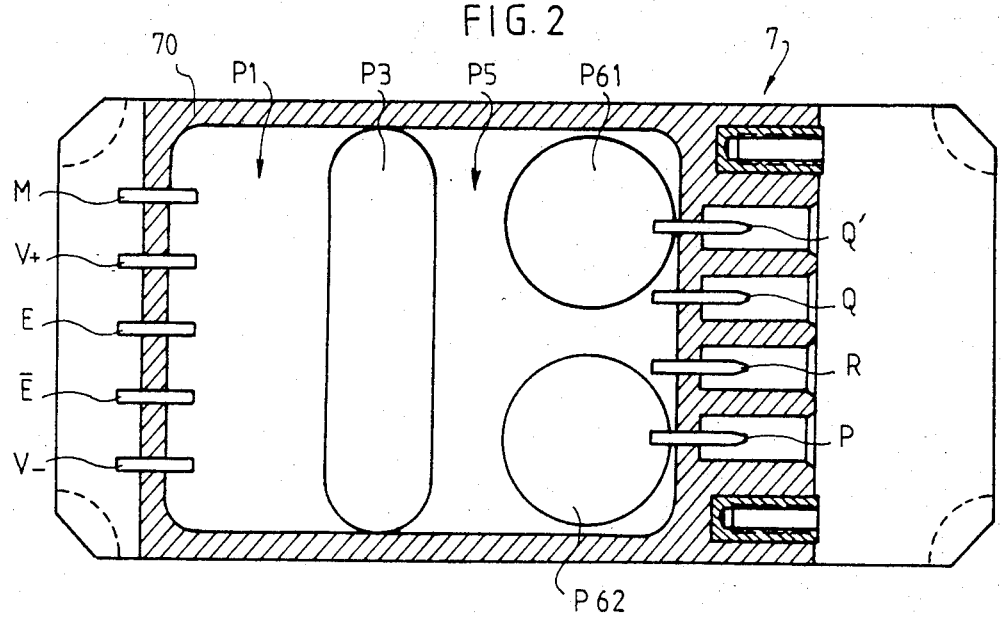
FIG. 2 is a plan view of a housing suitable for containing the FIG. 1 amplifier circuit implemented in hybrid circuit technology.
Figure 8:
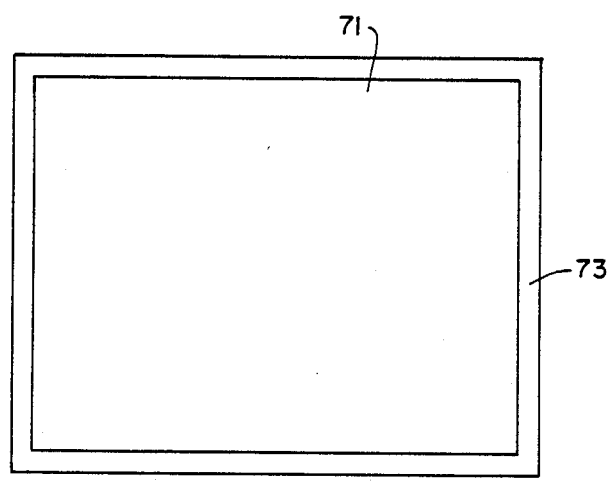

The Applicant has integrated the FIG. 1 circuit in a ceramic housing such as that shown in FIG. 2. The input and output terminals as described above can be seen again and are not described a second time. These terminals pass through the side walls 70 of the housing. FIG. 2 shows emplacements P1, P3 and P5 for the portions 1, 3 and 5 of the FIG. 1 circuit. These emplacements are all inside the side wall 70 of the ceramic housing which has been given an overall reference 7. In the emplacement P5 there are two disk-shaped hollows P61 and P62 for receiving heatsinks which are thermally connected to the switches 61 and 62 for dissipating the heat generated thereby.

FIG. 3 is substantially identical to FIG. 2 but is turned end-to-end so as to correspond more closely with FIGS. 4, 5 and 6. FIG. 3 additionally shows an extra alumina plate A13 which is glued over the hollow of the central emplacement P3 for receiving ferrite pots to constitute the transformers of the middle portion 3 of the amplifier circuit.

Each of the circular hollows P61 and P62 receives a copper disk such as PC61. The substrate of the chip on which the corresponding switch is formed is in turn brazed to the copper disk. FIG. 4 shows a chip PP61 for the switch 61.

The use of such copper disks is satisfactory provided there is excellent contact over the entire contact area between the disk such as PC61 and the alumina from which the remainder of the housing 7 is made.

Good contact may be obtained by the method described below. Mention is made initially of sockets 79-1 and 79-2 on either side of the high voltage terminals for mechanical connection to a connector. The housing is closed by a cover 71 made of alumina and fitted with a metal cap which overlaps sideways at 73 to come opposite a corresponding metallized face 74 at the top of the side wall 70 of the housing 7.

The ceramic housing can be satisfactorily constructed by fully brazing the naked ceramic. This full brazing concerns not only the copper tabs PC61 and PC62, but also the inlet and outlet pins P, Q, Q', R and V−, V+, E, $\overline{E}$, and M, and a Kovar frame for closing. Tooling is provided to apply a predetermined pressure on the Kovar ring, the inlet/outlet pins and their associated brazing inserts, and the copper tabs and their associated brazing inserts. The assembly is then placed in an oven at the usual brazing temperature under an inert atmosphere containing some hydrogen. Any deformations which appear after passing through the oven can subsequently be corrected by mechanically machining the alumina housing. A suitable brazing technique is described in French patent specification published under the number 2 217 290.

The transformers are made after this preparation (or separately) as described with reference to FIGS. 9A, 9B and 10.

Figure 9A:
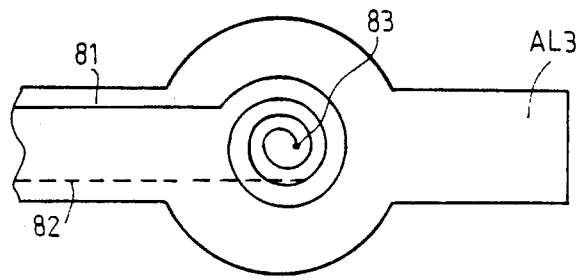
FIGS. 9A and 9B are a plan view and a section view showing how a winding may be silk-screened on a ceramic substrate.
Figure 9B:
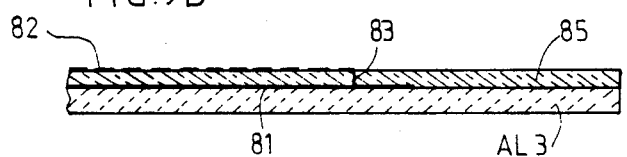

FIG. 9A shows how a winding may be made in the form of a thick-film silk screened spiral line on the alumina plate A13. The winding shown at 81 includes three turns. Its central end stops at 83. At this point (see FIG. 9B), the winding is connected via a hole 83 passing through a dielectric layer 85 placed on the alumina plate A13 to a track 82 on the opposite face of the dielectric layer. A very thin silk-screened winding is thus made between lines 81 and 82.

The Applicant has observed that it is possible not only to apply conductor patterns by means of silk-screened conductive ink and insulating layers such as the layer 85, but also to deposit several thicknesses of dielectric in order to obtain very high electrical insulation. The dielectric layer may be made of glass, for example.

Figure 10:
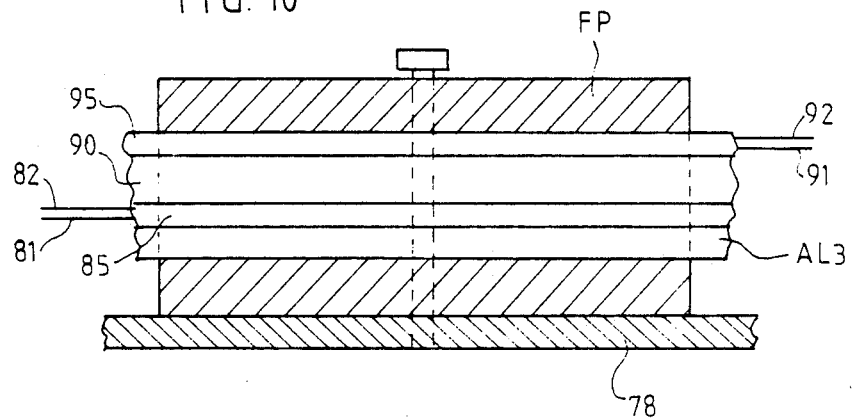
FIG. 10 is a diagram showing the general structure of one of the FIG. 1 transformer components made using hybrid circuit technology.

Thus, in FIG. 10, there can be seen a thin metallized plate 78 placed at the bottom of the hollow P3 and fixed thereto. A ferrite pot FP is fixed to the plate, and one of the arms of the alumina plate A13 passes through the ferrite pot. The plate A13 is generally E-shaped, providing one arm for each transformer. The arm shown in FIG. 10 has the shape shown in FIG. 9A, i.e. a central disk with diametrically opposite tabs projecting therefrom. A first winding is deposited on the arm as shown in FIG. 9A. There then follow a plurality of layers of glass, typically six to eight layers all built up from a silk-screenable glass and visible at 90 to obtain the desired degree of electrical insulation. Finally, there is a top dielectric layer 95 on which a secondary winding is deposited between terminals 91 and 92.

In a manner which is unexpected a priori, it has appeared that such an assembly is perfectly capable of withstanding the voltages associated with a potential difference between the input ground and the output ground which may reach several thousand volts.

Three ferrite pots such as that shown diagrammatically in FIG. 10 are thus placed in the recess P3, each pot being placed around a respective one of the three arms of the E-shaped ceramic plate A13. These three pots and the associated windings deposited on the arms of the ceramic plate constitute the three transformers shown in FIG. 1.

The chips on which the switches 61 and 62 are formed are brazed to the copper disks PC61 and PC61 (not shown).

Implementing the input circuit 1 in the form of a hybrid circuit is considered to be well known to the person skilled in the art.

The same is true of the output circuit 5, in which the only technological problem lies with heat sinking the switches 61 and 62, which problem is solved in the manner described above.

After the other components have been inserted in the housing at emplacements P1 and P5, the housing is closed by means of its cover 71. The interior of the housing is filled with a nitrogen atmosphere which is dry, i.e. having less than 3000 ppm of water.

The circuit obtained in this manner gives the required characteristics of high voltage isolation, common mode rejection, gain, response time, and bandwidth, and its thermal response is satisfactory.

For example, it has been possible to obtain an output signal of about 400 volts from an input signal of about 1 volt and with a potential difference of about 4000 volts between respective signal grounds. The circuit operates on rectangular signals having a variable form factor and a recurrence frequency of up to about 1 MHz, its response time is a few tens of nanoseconds.

I claim:

1. An isolated amplifier circuit for amplifying pulses, in particular for a high voltage output, the amplifier comprising a low voltage input stage connected via transformers to a high voltage output stage, and including the improvement wherein:

the transformers comprise a central transformer having one primary winding and two oppositely-wound secondary windings, and two end transformers each having a primary winding and a secondary winding;

the low voltage input stage comprises an input amplifier, a differentiator and two oscillators, the amplifier output being fed via the differentiator to the primary winding of the central transformer and being connected to both oscillators in such a manner as to actuate one or other of the two oscillators depending on its polarity, each of the oscillators being connected to the primary winding of a respective one of the two end transformers; and the output stage comprises two controllable switches connected symmetrically in series about a mid point, each of the switches being controlled, via a respective shaping circuit, by a respective one of the secondary windings of the central transformer and also by the secondary winding of a respective one of the end transformers.

2. An amplifier circuit according to claim 1, wherein the amplifier circuit is made in the form of a hybrid circuit on a ceramic substrate in a housing which is likewise made of ceramic, which housing is sealed, and is filled with an inert atmosphere.

3. An amplifier circuit according to claim 2, wherein the said transformers are made by silk-screening the windings on a ceramic support, with insulating layers being interposed between the primary windings and the secondary windings.

4. An amplifier circuit according to claim 2, wherein the switches are constituted by power transistors on individual chips, which chips are mounted on copper disks that are in turn brazed to the ceramic housing.

5. An amplifier circuit according to claim 1 or 4, wherein the switches are constituted by MOSFETs.

6. An amplifier circuit according to claim 2, wherein the housing contains an atmosphere of dry nitrogen.

* * * * *

UNITED STATES PATENT AND TRADEMARK OFFICE
CERTIFICATE OF CORRECTION

PATENT NO. : 4,565,931
DATED : January 21, 1986
INVENTOR(S) : Michael J. R. Fumey It is certified that error appears in the above-identified patent and that said Letters Patent are hereby corrected as shown below:

Page 1, [73] Assignee: please correct the name of the assignee from "Electronizue Serge Dassault S.A." to --Electronique Serge Dassault, Societe Anonyme--.

This certificate supersedes Certificate of Correction issued August 26, 1986.

Signed and Sealed this

Seventeenth Day of February, 1987

Attest:

DONALD J. QUIGG

Attesting Officer     Commissioner of Patents and Trademarks